United States Patent
Wu et al.

[11] Patent Number: 6,162,670
[45] Date of Patent: Dec. 19, 2000

[54] METHOD OF FABRICATING A DATA-STORAGE CAPACITOR FOR A DYNAMIC RANDOM-ACCESS MEMORY DEVICE

[75] Inventors: King-Lung Wu, Tainan Hsien; Chuan-Fu Wang, Taipei Hsien, both of Taiwan

[73] Assignee: United Microelectronics Corp., Hsinchu, Taiwan

[21] Appl. No.: 09/196,722

[22] Filed: Nov. 20, 1998

[51] Int. Cl.$^7$ ............................................. H01L 21/8234
[52] U.S. Cl. .......................... 438/238; 438/254; 438/397
[58] Field of Search .................................. 438/253, 254, 438/257, 396, 397, 691, 696, 706

[56] References Cited

U.S. PATENT DOCUMENTS

| | | | |
|---|---|---|---|
| 5,888,866 | 3/1999 | Chien | 438/254 |
| 6,027,761 | 3/1999 | King | 427/79 |

*Primary Examiner*—David Nelms
*Assistant Examiner*—Quoc Hoang
*Attorney, Agent, or Firm*—Ratner & Prestia

[57] ABSTRACT

A method is provided for fabricating a data-storage capacitor for a DRAM device, which can help increase the capacitance of the resulted capacitor. By this method, a first insulating layer, a second insulating layer, and a third insulating layer are sequentially formed over the substrate. An opening is formed in the third insulating layer, and a contact hole is formed to expose a source/drain region in the substrate. Subsequently, a conductive layer is formed over the third insulating layer, which is electrically connected to the exposed source/drain region. Next, a fourth insulating layer is formed over the conductive layer. A surface part of the third and fourth insulating layers is removed until reaching a predefined depth to allow an upper part of the conductive layer to be exposed. Next, conductive sidewall spacers are formed on the exposed part of the conductive layer to increase the surface area of the conductive layer. The combined structure of the conductive layer and the conductive sidewall spacers serves as a bottom electrode. Subsequently, a dielectric layer is formed over the bottom electrode, and then a top electrode is formed over the dielectric layer. This completes the forming of the intended data-storage capacitor for the DRAM device. In the resulted capacitor structure, the provision of the conductive sidewall spacers can help increase the surface area of the bottom electrode, thereby increasing the capacitance of the resulting capacitor.

12 Claims, 3 Drawing Sheets

METHOD OF FABRICATING A DATA-STORAGE CAPACITOR FOR A DYNAMIC RANDOM-ACCESS MEMORY DEVICE

BACKGROUND OF THE INVENTION

1. Field of the Invention

This invention relates to semiconductor fabrication technology, and more particularly, to a method of fabricating a data-storage capacitor for a dynamic random-access memory (DRAM) device.

2. Description of Related Art

As DRAM integration is increased, the various circuit components in a DRAM device are downsized. Fundamentally, a DRAM cell is composed of a field effect transistor (FET) and a data-storage capacitor for storing binary data. The data retaining capability of a DRAM device is proportional to the capacitance of its data-storage capacitor. Therefore when a DRAM device is downsized for higher integration, the capacitance of its data-storage capacitor is also downsized, which would cause the data retaining capability of the downsized capacitor to be reduced. The data retaining capability of the downsized DRAM may thus be unreliable. Moreover, as the capacitance is reduced, the likelihood of soft errors arising from the incidence of ($\alpha$-rays increases. To hold data reliably, a DRAM capacitor with a reduced capacitance needs to be more frequently refreshed. One solution to increase the capacitance is to use a dielectric material with a high dielectric constant to form the dielectric layer in the capacitor. The capacitance can also be increased by using a stacked structure to form the capacitor. These solutions, however, are still unable to provide the desired capacitance.

Another solution is to use the so-called trench-shaped capacitor that can help increase the surface area of the electrodes of the capacitor and also help reduce the thickness of the dielectric film so that the capacitance of the capacitor can be increased. This solution, however, results in low yield and low reliability.

Some new high-capacitance capacitor structures, such as the so-called hemispherical-grain polysilicon (HSG polysilicon) capacitor and the reverse-crown capacitor, are now widely used as the data-storage capacitors in DRAMs. The HSG polysilicon capacitor has its bottom electrode formed from HSG polysilicon in such a manner that can help increase the surface area of the bottom electrode and is therefore large in capacitance. Moreover, in a stacked capacitor, the capacitance can be increased by increasing the height of the stacked cells in the capacitor. However, if the height extends to the peripheral circuit area, it causes difficulties in cell planarization and the fabrication of metal interconnects. Therefore, there is a limit to the capacitance that can be increased by using the stacked capacitor. In view of the forgoing problems, there still exists a need in the DRAM industry for new methods that can help further increase the capacitance of the data-storage capacitor in DRAM.

SUMMARY OF THE INVENTION

It is therefore an objective of the present invention to provide a method for fabricating a data-storage capacitor for a DRAM device, which can help increase the capacitance of the resulted capacitor.

In accordance with the foregoing and other objectives of the present invention, a new method is proposed for fabricating a data-storage capacitor for a DRAM device. The method of the invention is provided for fabricating a data-storage capacitor for a DRAM device constructed on a semiconductor substrate which is already formed with a FET having a gate and a pair of source/drain regions. The method of the invention includes the following procedural steps. First, a first insulating layer is formed over the substrate. Next, a second insulating layer is formed over the first insulating layer. Then, a third insulating layer is formed over the second insulating layer. After this, an opening is formed in the third insulating layer, and a contact hole is formed in such a manner as to penetrate through the second insulating layer and the first insulating layer to expose a selected one of the source/drain regions of the FET. Subsequently, a conductive layer is formed over the third insulating layer. The conductive layer fills the contact hole in the first insulating layer but not the opening in the third insulating layer. Next, a fourth insulating layer is formed over the conductive layer. Then, the fourth insulating layer and the conductive layer are partly removed until the surface of the third insulating layer is exposed. Next, a surface part of the fourth insulating layer and the third insulating layer is removed until reaching a predefined depth into the fourth insulating layer and the third insulating layer to allow part of the conductive layer to be exposed. It is a characteristic feature of the invention that conductive sidewall spacers are formed on the exposed part of the conductive layer to increase the surface area of the conductive layer. Then, the third insulating layer and the fourth insulating layer are entirely removed. The combined structure of the conductive layer and the conductive sidewall spacers then serve as a bottom electrode. Subsequently, a dielectric layer is formed over the bottom electrode, and then a top electrode is formed over the dielectric layer. The top electrode, the dielectric layer, and the bottom electrode in combination constitute the intended data-storage capacitor for the DRAM device.

In the resulting capacitor structure, the provision of the conductive sidewall spacers can help increase the surface area of the bottom electrode, thereby increasing the capacitance of the resulted capacitor.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method of the invention for fabricating a data-storage capacitor for a DRAM device is disclosed in the following with reference to FIGS. 1A–1G.

Figure 1A:
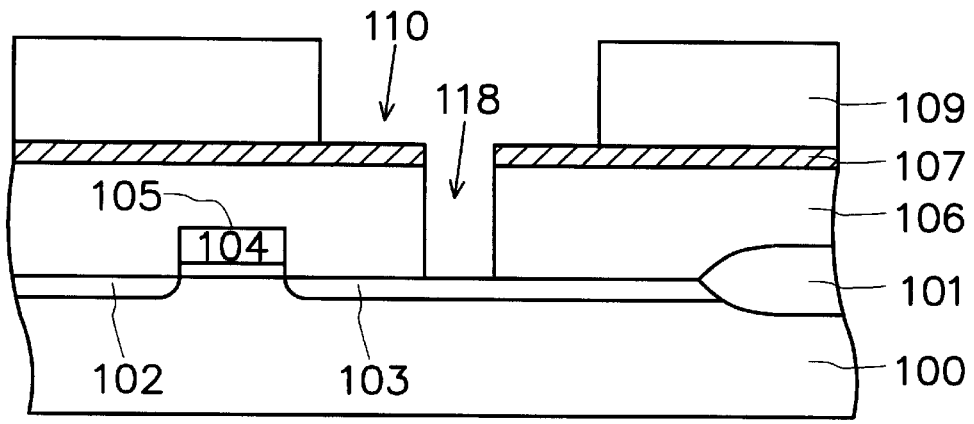
FIGS. 1A–1G are schematic sectional diagrams used to depict the steps involved in the method of the invention for fabricating a data-storage capacitor for a DRAM device.

Referring to FIG. 1A, the DRAM device is constructed on a semiconductor substrate 100, such as a P-type silicon substrate. A plurality of isolation structures 101 (only one is shown), such as field oxide layers or STI (shallow-trench isolation) structures, are formed at predefined locations in the substrate 100 to define a plurality of active regions each being used to form one DRAM cell. Next, an FET (field effect transistor) 105 is formed in each active region. The FET 105 includes a gate 104, a first source/drain region 102, and a second source/drain region 103. The process steps through which the FET 105 is formed are conventional and not within the spirit and scope of the invention, so description thereof will not be detailed.

A first insulating layer 106, such as a layer of silicon oxide, is formed over the substrate 100, covering both the FET 105 and the isolation structure 101. After this, a second insulating layer 107 serving as an etch-end layer is formed over the first insulating layer 106. A contact hole 118 is formed in such a manner as to penetrate through the second insulating layer 107 and the first insulating layer 106 to expose the second source/drain region 103. Then, a third insulating layer 109 is formed, for example, from silicon oxide through a PECVD (plasma-enhanced chemical-vapor deposition) process over the second insulating layer 107. The third insulating layer 109 is then selectively removed to form an opening 110 directly above the contact hole 118. The opening 110 in the third insulating layer 109 is larger in width than the contact hole 118 in the first insulating layer 106.

It is to be noted that there are many ways to form the contact hole 118 and the opening 110. The above process is only one of them. Those skilled in the art of semiconductor fabrication can design various other different ways to form the contact hole 118 and the opening 110.

Figure 1B:
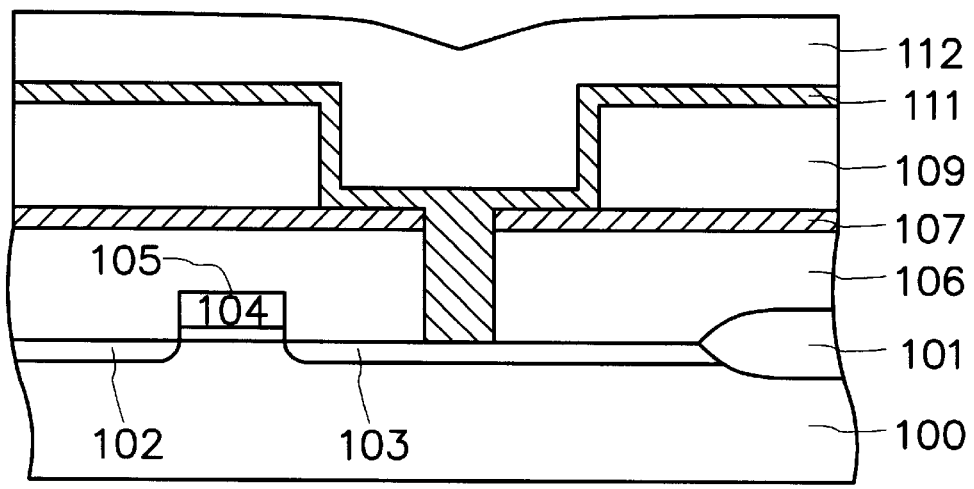

Referring to FIG. 1B, in the subsequent step, a first conductive layer 111 is formed from doped polysilicon over the wafer in such a manner as to fill the entire contact hole 118 and be laid to a substantially uniform thickness of about 500 Å (angstrom) over the exposed surfaces of the third insulating layer 109 but not filling the opening 110 in the third insulating layer 109. The conductive layer 111 is thus electrically connected to the second source/drain region 103. After this, a fourth insulating layer 112 is formed, for example, from silicon oxide through a PECVD process to a thickness of about 7,000 Å over the first conductive layer 111. Through this process, the fourth insulating layer 112 fills the entire opening 110 in the third insulating layer 109.

Figure 1C:
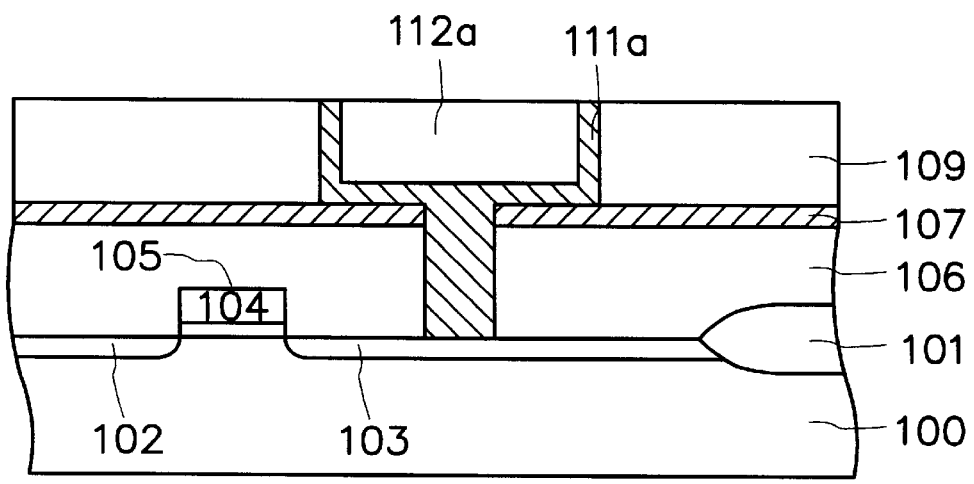

Referring to FIG. 1C, in the subsequent step, a CMP (chemical-mechanical polish) process is performed on the wafer until the topmost surface of the third insulating layer 109 is exposed. Through this process, the fourth insulating layer 112 and the conductive layer 111 are partly polished away (the remaining part of the fourth insulating layer 112 is here designated by the reference numeral 112a, and the remaining part of the conductive layer 111 is here designated by the reference numeral 111a for distinguishing purposes).

Figure 1D:
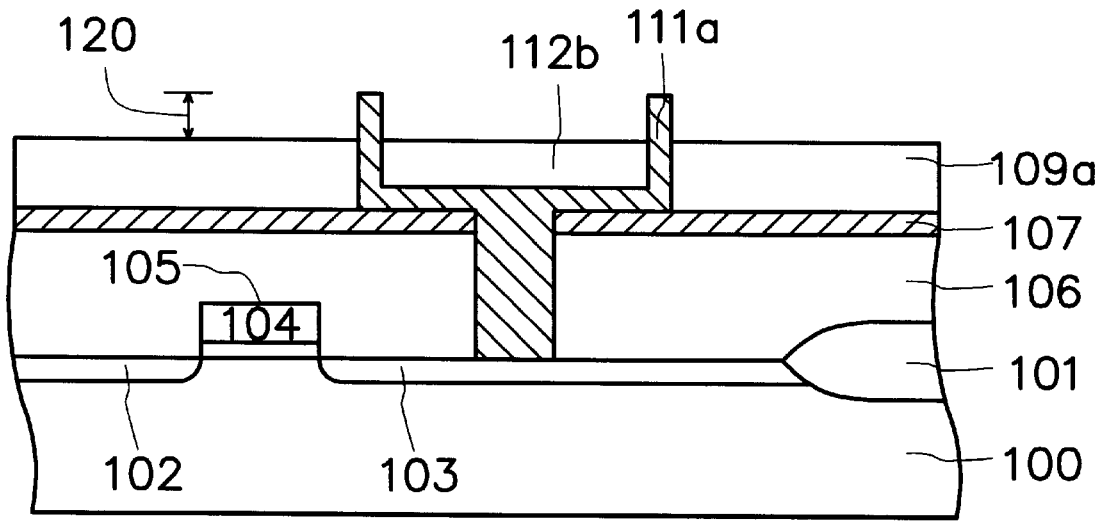

Referring to FIG. 1D, in the subsequent step, an anisotropic etching process, such as a dry-etching process, is performed on the wafer to a controlled depth of about 3,500 Å into the fourth insulating layer 112a and the third insulating layer 109 (the remaining part of the fourth insulating layer 112a is here designated by the reference numeral 112b, and the remaining part of the third insulating layer 109 is here designated by the reference numeral 109a). This makes an upper part of the conductive layer 111a protrude out from the insulating layers 109a, 112b.

Figure 1E:
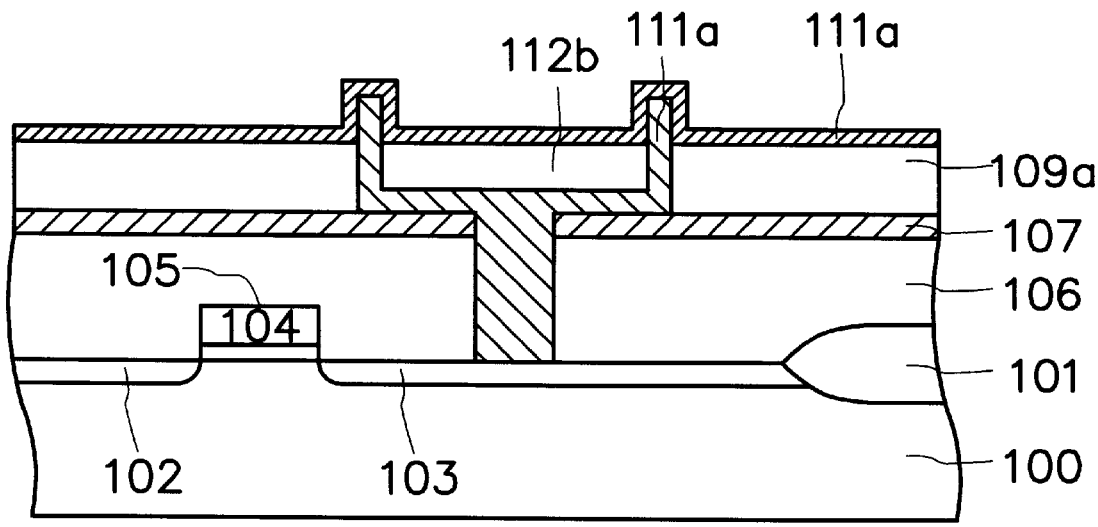

Referring to FIG. 1E, in the subsequent step, a second conductive layer 113 is formed over the wafer, preferably from doped polysilicon through deposition to a thickness of about 500 Å. The second conductive layer 113 covers all the exposed surfaces of the third insulating, layer 109a the fourth insulating layer 112b, and the first conductive layer 111a.

Figure 1F:
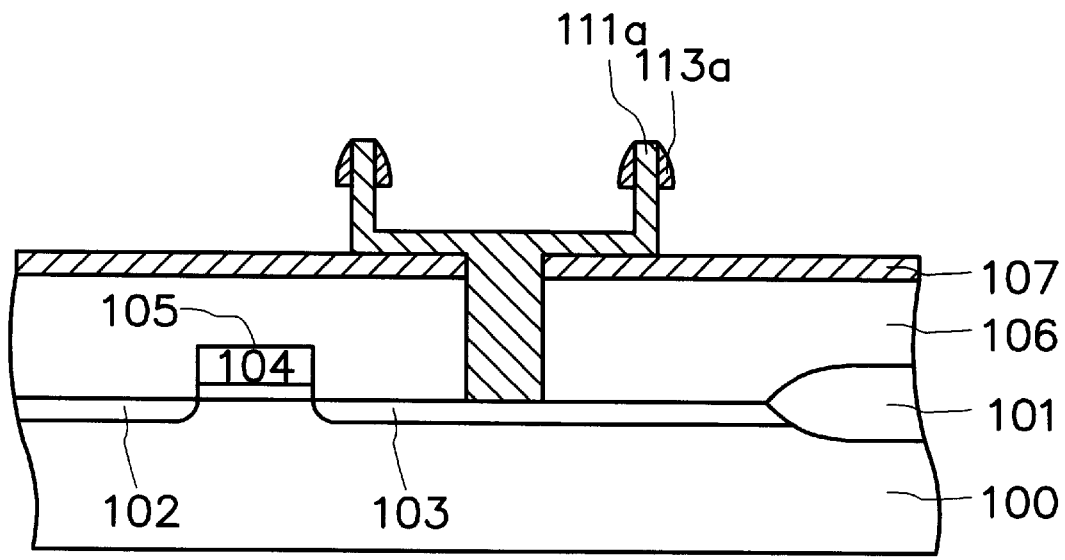

Referring to FIG. 1F, in the subsequent step, an anisotropic etching process, such as a dry-etching process, is performed to etch away part of the second conductive layer 113 until exposing the third insulating layer 109a and the fourth insulating layer 112b (the remaining portions of the second conductive layer 113 are left on the sidewalls of the exposed upper part of the first conductive layer 111a and are here designated by the reference numeral 113a and referred to as conductive sidewall spacers). After this, an isotropic etching process, such as a wet-etching process, is performed to etch away the whole of the third insulating layer 109a and the fourth insulating layer 112b. The combined structure of the first conductive layer 111a and the conductive sidewall spacers 113a then serve as an electrode structure (i.e., bottom electrode) for the intended data-storage capacitor of the DRAM cell.

Figure 1G:
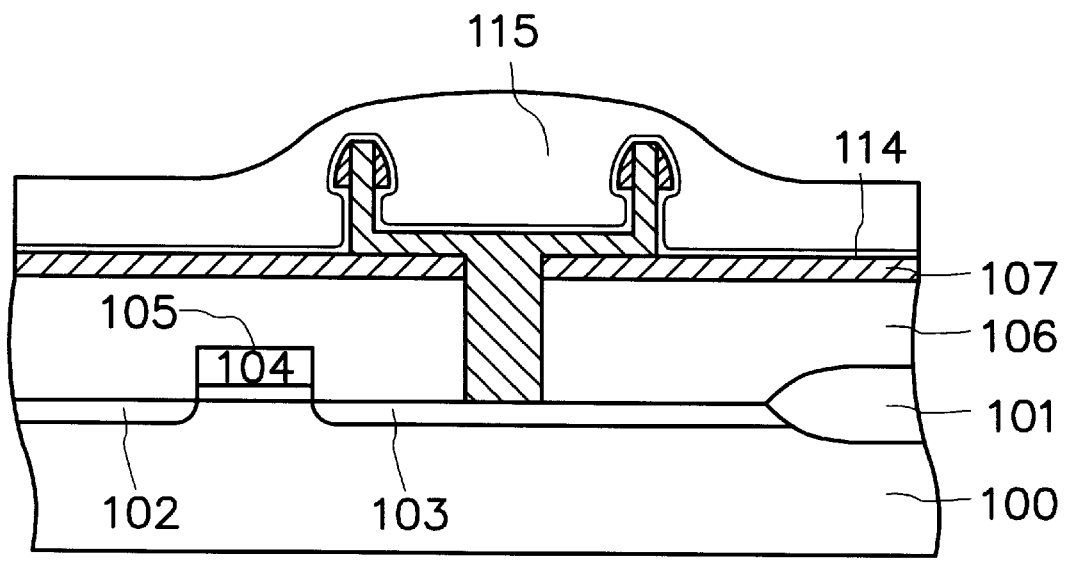

Referring to FIG. 1G, in the subsequent step, a dielectric layer 114 is formed over the wafer through deposition of a dielectric material with a high dielectric constant, such as silicon oxide, silicon nitride, NO (silicon nitride/silicon oxide), ONO (silicon oxide/silicon nitride/silicon oxide). The dielectric layer 114 covers all the exposed surfaces of the second insulating layer 107 and the bottom electrode (i.e., the combined structure of the first conductive layer 111a and the conductive sidewall spacers 113a).

Next, a third conductive layer 115 is formed over dielectric layer 114 to serve as the top electrode for the intended data-storage capacitor.

The third conductive layer 115 (top electrode), the dielectric layer 114, and the combined structure of the first conductive layer 111a and the conductive sidewall spacers 113a (bottom electrode) in combination constitute the intended data-storage capacitor for the DRAM cell.

It can be learned from the foregoing description that the provision of the conductive sidewall spacers 113a on the bottom electrode can help increase the surface area of the bottom electrode, thereby increasing the capacitance of the resulted capacitor.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a data-storage capacitor for a DRAM device constructed on a semiconductor substrate which is already formed with a FET having a gate and a pair of source/drain regions, comprising the steps of:

forming a first insulating layer over the substrate;

forming a second insulating layer over the first insulating layer;

removing a selected part of the second insulating layer that is laid directly above a selected one of the source/drain regions of the FET to form a first opening in the second insulating layer;

forming a third insulating layer over the second insulating layer;

performing a selective etching process on the third insulating layer to form a second opening in the third insulating layer, with the etching process also acting on the part of the first insulating layer that is uncovered by the second insulating layer to thereby form a contact hole in the first insulating layer which exposes the selected one of the source/drain regions of the FET, wherein the second opening is directly above the contact hole;

forming a conductive layer over the third insulating layer, the conductive layer filling the contact hole in the first insulating layer but not filling the second opening in the third insulating layer;

forming a fourth insulating layer over the conductive layer, the fourth insulating layer filling the second opening in the third insulating layer;

removing part of the fourth insulating layer and the conductive layer until the surface of the third insulating layer is exposed;

removing a surface part of the fourth insulating layer and the third insulating layer until reaching a predefined depth into the fourth insulating layer and the third insulting layer to allow an upper part of the conductive layer to be exposed above a substantially planar upper insulating surface;

forming conductive sidewall spacers on the exposed part of the conductive layer;

removing the third insulating layer and the fourth insulating layer entirely; the combined structure of the conductive layer and the conductive sidewall spacers serving as a bottom electrode;

forming a dielectric layer over the bottom electrode; and forming a top electrode over the dielectric layer, wherein the top electrode, the dielectric layer, and the bottom electrode in combination constitute the intended data storage capacitor for the DRAM device.

2. The method of claim 1, wherein the fourth insulating layer is formed to a thickness of about 7,000 Å.

3. The method of claim 1, wherein the conductive layer is formed from doped polysilicon.

4. The method of claim 1, wherein the conductive layer is formed to a thickness of about 500 Å.

5. The method of claim 1, wherein the partial removal of the fourth insulating layer and the third insulating layer to expose part of the conductive layer is performed to a depth of about 3,500 Å.

6. The method of claim 5, wherein the partial removal of the fourth insulating layer and the third insulating layer to expose part of the conductive layer is performed through a dry-etching process.

7. A method for fabricating a data-storage capacitor for a DRAM device constructed on a semiconductor substrate which is already formed with a FET having a gate and a pair of source/drain regions, comprising the steps of:

forming a first insulating layer over the substrate;

forming a second insulating layer over the first insulating layer;

forming a third insulating layer over the second insulating layer;

forming an opening in the third insulating layer;

forming a contact hole which penetrates through the second insulating layer and the first insulating layer to expose a selected one of the source/drain regions of the FET wherein the opening is directly above the contact hole;

forming a conductive layer over the third insulating layer, the conductive layer filling the contact hole in the first insulating layer but not filling the opening in the third insulating layer;

forming a fourth insulating layer over the conductive layer, the fourth insulating layer filling the opening in the third insulating layer;

removing a part of the fourth insulating layer and the conductive layer until a surface of the third insulating layer is exposed;

removing a surface part of the fourth insulating layer and the third insulating layer until reaching a predefined depth into the fourth insulating layer and the third insulating layer to allow a part of the conductive layer to be exposed above a substantially planar upper insulating surface;

forming conductive sidewall spacers on the exposed part of the conductive layer;

removing the third insulating layer and the fourth insulating layer entirely, the combined structure of the conductive layer and the conductive sidewall spacers serving as a bottom electrode;

forming a dielectric layer over the bottom electrode; and forming a top electrode over the dielectric layer, wherein the top electrode, the dielectric layer, and the bottom electrode in combination constitute the intended data-storage capacitor for the DRAM device.

8. The method of claim 7, wherein the fourth insulating layer is formed to a thickness of about 7,000 Å.

9. The method of claim 7, wherein the conductive layer is formed from doped polysilicon.

10. The method of claim 7, wherein the conductive layer is formed to a thickness of about 500 Å.

11. The method of claim 7, wherein the partly removal of the fourth insulating layer and the third insulating layer to expose part of the conductive layer is performed to a depth of about 3,500 Å.

12. The method of claim 7, wherein the partial removal of the fourth insulating layer and the third insulating layer to expose part of the conductive layer is performed through a dry-etching process.

* * * * *